(12) United States Patent
Makarov et al.

(10) Patent No.: US 8,088,222 B2
(45) Date of Patent: *Jan. 3, 2012

(54) METHOD, SYSTEM, AND APPARATUS FOR THE GROWTH OF ON-AXIS SIC AND SIMILAR SEMICONDUCTOR MATERIALS

(75) Inventors: Yuri Makarov, Richmond, VA (US); Michael Spencer, Ithaca, NY (US)

(73) Assignee: Widetronix Inc., Ithaca, NY (US)

( * ) Notice: Subject to any disclaimer, the term of this patent is extended or adjusted under 35 U.S.C. 154(b) by 1193 days.

This patent is subject to a terminal disclaimer.

(21) Appl. No.: 11/829,215

(22) Filed: Jul. 27, 2007

(65) Prior Publication Data

US 2009/0025641 A1  Jan. 29, 2009

(51) Int. Cl.
*C30B 29/00* (2006.01)
(52) U.S. Cl. ............................ 117/90; 117/101; 117/104
(58) Field of Classification Search .................... 117/90, 117/101, 104
See application file for complete search history.

(56) References Cited

U.S. PATENT DOCUMENTS

| 4,133,689 A * | 1/1979 | Stroke ............................. 501/88 |
| 5,119,540 A * | 6/1992 | Kong et al. ................... 118/730 |
| 6,217,842 B1 | 4/2001 | Tanino |
| 6,689,212 B2 | 2/2004 | Kuhn et al. |
| 7,192,482 B2 | 3/2007 | Mueller et al. |
| 7,247,513 B2 | 7/2007 | Kordina |

* cited by examiner

*Primary Examiner* — Bob M Kunemund
(74) *Attorney, Agent, or Firm* — Maxvalue IP LLC

(57) ABSTRACT

A novel approach for the growth of high-quality on-axis epitaxial silicon carbide (SiC) films and boules, using the Chemical Vapor Deposition (CVD) technique, is described here. The method includes a method of substrate preparation, which allows for the growth of "on-axis" SiC films, plus an approach giving the opportunity to grow silicon carbide on singular (a small-angle miscut) substrates, using halogenated carbon-containing precursors (carbon tetrachloride, $CCl_4$, or halogenated hydrocarbons, $CHCl_3$, $CH_2Cl_2$, or $CH_3Cl$, or similar compounds or chemicals), or introducing other chlorine-containing species, in the gas phase, in the growth chamber. At gas mixtures greater than the critical amount, small clusters of SiC are etched, before they can become stable nuclei. The presence of chlorine and the formation of gas species allow an increased removal rate of these nuclei, in contrast to the growth without the presence of chlorine. Or, alternatively, the novel precursors introduced in the growth system reduce the effective supersaturation ratio of the Si species in the growth layer. The reduction of the supersaturation ratio reduces or eliminates the 2D (and 3C—SiC) nucleation which would occur due to the large terrace widths present on the on-axis wafers. This allows the growth of Silicon Carbide epitaxial layers on SiC substrates or composite substrates with monocrystalline layers. This can also be applied to the other semiconductors, chemicals, compounds, materials, growth methods, or devices.

15 Claims, 5 Drawing Sheets

METHOD, SYSTEM, AND APPARATUS FOR THE GROWTH OF ON-AXIS SIC AND SIMILAR SEMICONDUCTOR MATERIALS

RELATED APPLICATIONS

The current application is related to the two co-pending application Ser. Nos. 11/626,388 and 11/626,387, both filed Jan. 24, 2007, both owned by one of the assignees of the current application (Widetronix Inc., Ithaca, N.Y.), and both have the same inventors as the ones in the current case: Yuri Makarov and Michael Spencer. The entire contents of which are incorporated herein, by reference.

FIELD OF THE INVENTION

The disclosure relates to the semiconductor materials. More specifically, the disclosure relates to the epitaxial growth of silicon carbide and similar materials, by chemical vapor deposition and other growth methods.

BACKGROUND OF THE INVENTION

Silicon Carbide

The superior properties of silicon carbide, as compared with silicon, make it a perspective material for high power and high-temperature electronics (e.g. high-power transistors, thyristors, devices with P-type and N-type conductivity layers (e.g. diodes), and rectifiers). Due to an extremely high thermal conductivity (3.9 W/cm*K for SiC, vs. 1.3 for Si) and high breakdown voltage (1 MV/cm for SiC, vs. 0.3 MV/cm for Si), the SiC-based device structures are able to operate at much higher terminal voltages and output powers. The wide bandgap of SiC (>3.0 eV for hexagonal SiC, vs. 1.1 eV for Si) provides a low leakage current of the p-n junction, even at high temperatures. In addition, SiC exhibits a remarkable mechanical and chemical stability.

Despite the obvious advantages, wide-scale application of SiC in the device industry is currently hindered by difficulties arising in manufacturing of SiC-based structures of the required high quality (and by their high costs). The improvement of the quality of the growing epitaxial layers seems to be the most important task at the moment. This task includes the achievement of a good surface morphology, high thickness uniformity, an accurate stoichiometry, and a low defect density of the epilayers.

One item that presently hinders the realization of stable bipolar devices (for example) is stacking faults, which are generated from basal plane dislocations that have propagated from the substrate into the active region of the device during epitaxial growth. While it is difficult to suppress the nucleation of stacking faults, if the epitaxy is performed on on-axis substrates the basal plane dislocations terminating in the active region will be substantially reduced due to geometrical considerations. Considering on-axis substrates, the basal plane dislocations are more efficiently converted into relatively harmless threading edge dislocations, as opposed to off-axis substrate growth where many basal plane dislocations remain in the active structure and are subsequently converted into stacking faults during device operation. In on-axis growth, basal plane defects are effectively converted, resulting in improved device performance and reliability.

Defects in SiC

Commercial quality SiC wafers and epilayers include threading screw, threading edge, and basal plane (which can have edge and screw components) dislocations. Threading dislocations propagate with a component parallel to the c-axis, while dislocations that lie perpendicular to the c-plane are termed basal-plane dislocations. In SiC, it is energetically favorable for the basal plane dislocations to decompose into partial dislocations which bound a planar stacking fault defect. These stacking faults, if present in the active region of the device, result in devices with functional properties that can change unpredictably during operation. However, if the basal-plane dislocations are efficiently converted into threading edge dislocations, the "killer" stacking faults will not be generated. Efficient conversion of basal plane dislocation to threading edge dislocation can occur if on-axis epitaxy can be accomplished.

Polytypes of SiC

Silicon carbide can form into over 150 different polytypes. The main forms are 4H, 6H, and 3C (the cubic form). In the absence of growth steps, the 3C polytype forms during epitaxy. Growth steps are produced by screw dislocations, substrate miscut/cut, or preferential etching.

On-Axis Epitaxial Growth of 4H—SiC and 6H—SiC

High temperature epitaxial growth of 4H—SiC and 6H—SiC is normally performed using wafers which have been miscut at an angle of 8 or 4 degrees, respectively, toward the (1100) or (1,1,2b,0) direction. The miscut substrates are used in order to produce a high density of growth steps which are available for atomic attachment at kink sites located on the steps. It was found that if "on-axis" wafers are used, the growth is three dimensional due to high supersaturation of the growth layer. As a result a high density of 3C polytype inclusions or a poor morphology due to 2D nucleation will be produced.

SUMMARY OF THE INVENTION

In one aspect, the disclosure relates to a system, method, and apparatus that improve the quality of the semiconductor materials used in electronic devices, particularly power electronic devices relative to what is presently used. In various embodiments, the disclosure relates to an improved process for minimizing crystal defects in silicon carbide epitaxial material and the resulting improved structures and devices. The described technique can also be applied to the similar structures, devices, material systems, and growth methods.

Growth on the On-Axis Substrate

In one aspect, the disclosure provides for growth of SiC on on-axis wafers. This type of growth is also important for the production of substantially drift-free PIN diodes and other high power devices, fabricated from SiC. It is generally accepted that polytype replication during SiC growth is accomplished by a process known as step-flow epitaxy. In the step flow growth mode, silicon atoms migrate along the surface until they encounter a step-edge. At the step edge, the atoms are incorporated at kink sites into the crystal as described by the BCS theory [W. K. Burton, N. Cabrera and F. C. Frank, Philos Trans Roy. Soc. London A243, 299 (1951)]. The growth rate and surface morphology are dependant on the number of growth steps, supersaturation ratio of the growth species, and growth temperature. The interaction of these parameters for SiC is discussed (using BCS theory) in detail by Kimoto [Tsunenobu Kimoto and Hiroyuki Matsunami Journal of Applied Phys. Vol 75 Jan. 1994 pp. 850-859]. The substrate miscut determines the growth step density and the growth terrace width. At the high miscut angle employed for SiC growth (8 and 4 degrees), toward the 112b0 plane, the terrace widths are 17 angstroms and 36 angstroms, respectively.

Although we refer to "on-axis" wafers as singular (or zero degree off), in practice, they usually have a mis-cut of 0.1-0.2 degrees, or even as much/high as 1 degree off-axis (i.e. 0 to 1 degree range, off-axis). The distance between the steps here is significantly larger than that in the case of SiC growth on "off-axis" wafers (i.e. more than 1 degree off-axis).

The range of angles for "small-angle off-axis" substrate/ situation can even go beyond/above 1 degree, mentioned above. However, for the patent protection purposes, we present/use/specify/define/apply the following range of 0 to 10 degrees (small angles). Because for the small angles, the produced material exhibits substantially similar results (if not optimum, as the case for exactly on-axis).

For example, for a wafer with a 0.2 degree miscut, the terrace width is 721 angstroms, greater than 10 times the terrace width of the off-axis substrates. At these large terrace widths, the supersaturation of the growth species is high, and the probability of 2D nucleation and 3C polytype formation is significantly increased. Additionally, macro-step formation, due to step bunching, can occur. This phenomenon creates terraces with lateral dimensions of microns, further increasing the probability of 2D nucleation. At high growth rates and with a deficiency in the step edges, silicon atoms can form a cluster (before they will encounter a step edge). So, the terraces (regions between steps) can be filled with silicon clusters, which in turn cause 3C—SiC inclusions. Two opposite processes occur here: further cluster growth due to the addition of silicon atoms, migrating on the surface; and cluster evaporation, decreasing the cluster size. It is well-known that some critical size of such clusters exists, and if these clusters grow beyond this critical size, they will introduce regions of cubic SiC in the grown layer. Thus, the introduction of cubic SiC growth is quite likely during the growth on on-axis wafers.

Growth on on-axis substrates also suffers from poor morphology and defects due to the high supersaturation conditions of the growth. It is well known from crystal growth theory that conditions of high supersaturation produce 2D nucleation.

The addition of chlorine, such as from $CCl_4$, improves the material quality, by eliminating Si clusters and reducing the supersaturation ratio during epitaxial growth, as described below.

DETAILED DESCRIPTION OF THE PREFERRED EMBODIMENTS

Figure 1:
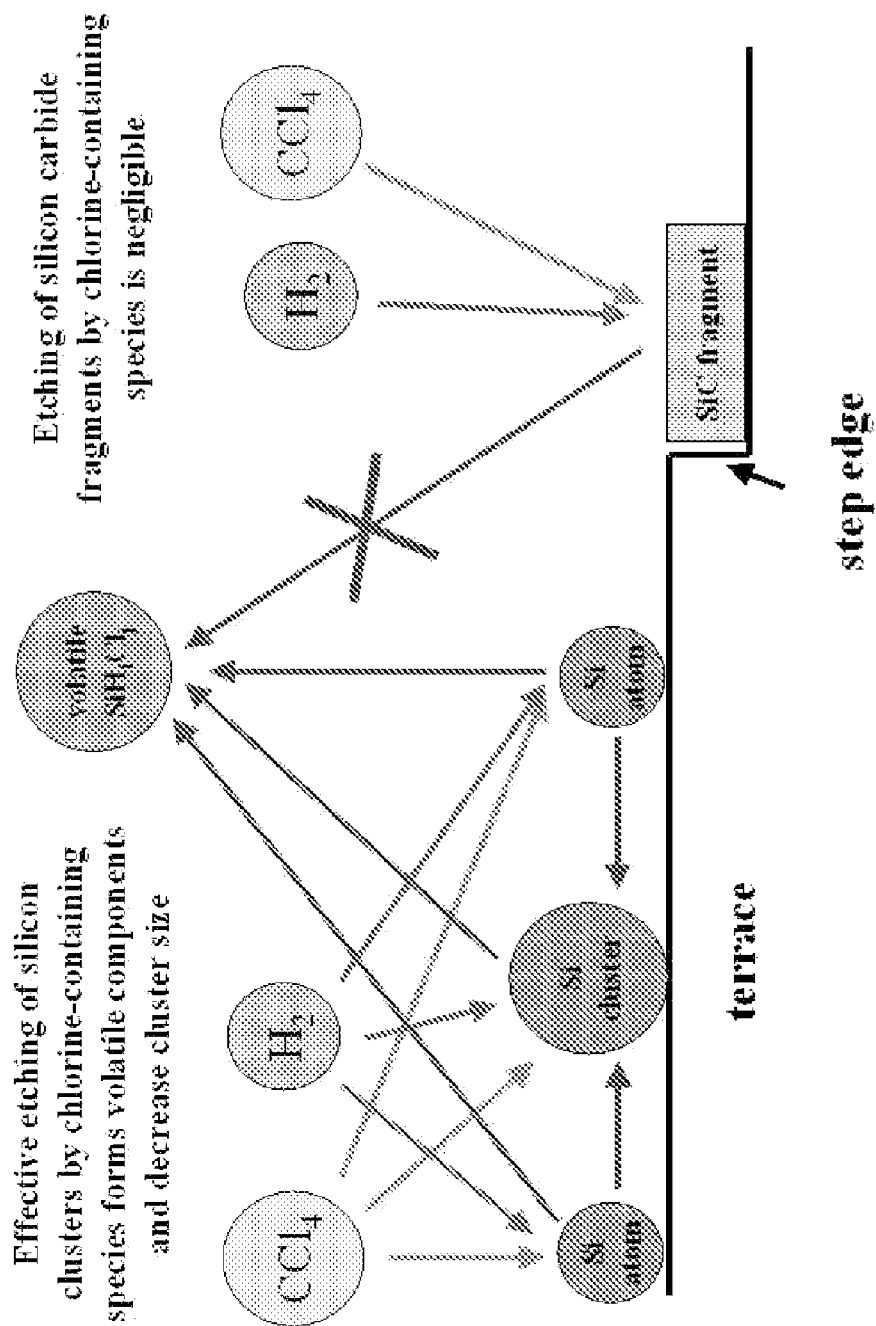
FIG. 1. The etching mechanism, preventing cubic SiC formation, during SiC growth on "on-axis" wafer. $CCl_4$ is considered as chlorine-containing species, here.

Chlorine addition provides two mechanisms for promotion of "on-axis" growth. First, chlorine provides an additional removal mechanism for silicon clusters. FIG. 1 illustrates the scheme of such a mechanism. The etching rate for silicon clusters is much higher than that for silicon carbide fragments, formed at the step edges. Effective etching of silicon clusters by chlorine-containing species forms volatile components and decreases average cluster size. So, one can expect that silicon clusters will be maintained below the critical size, for the following silicon-to-carbon and silicon-to-chlorine ratios:

$$x^{(int)}(Si)/x^{(int)}(C)=0.7-1.3,$$

$$x^{(int)}(Si)/x^{(int)}(Cl)=0.03-1,$$

where $x^{(int)}(Si)$, $x^{(int)}(C)$, $x^{(int)}(Cl)$ are the numbers of silicon, carbon, and chlorine atoms in the input gas mixture, respectively. As a result, cubic SiC growth will be suppressed on on-axis wafers, while polytype replication will be the dominant growth process. Thus, high quality SiC growth on the on-axis wafers becomes possible. As previously discussed, during on-axis growth, large size terraces are formed (due to step-bunching). If chlorine is used in the growth chamber, there is a simultaneous etching (which occurs during the growth). It has been experimentally shown that HCl etches the surface of "on-axis" SiC in such a way as to form periodic 6 bilayer steps. These steps are closely spaced (~0.3 micron), as compared to the terraces formed by step bunching (~1-2 micron), and they could provide sites for step flow growth.

A second mechanism for chlorine promotion of on-axis growth is the reduction of the supersaturation ratio during growth. The supersaturation ratio is the ratio of the number of adatoms in the growth layer to the number of adatoms in the growth layer under equilibrium conditions. In general, high quality crystal growth is performed as close to equilibrium as possible. In SiC growth, the growth rate (GR) is limited by mass transport of the species through the stagnant layer. The relationship of the growth rate to step dynamics is given by equation 1 [see Tsunenobu Kimoto and Hiroyuki Matsunami, Journal of Applied Phys. Vol 75 Jan. 1994 pp. 850-859]. If chlorine is not used, the only way to remove Si species from the growth surface is by evaporation (which is a function of the growth temperature). If excess Cl is available, Si can be removed as a volatile chloride:

$$GR = \left(\frac{2h\lambda_s}{\lambda_0 n_0}\right)(R - F_{Desorp})\tanh\left(\frac{\lambda_0}{2\lambda_s}\right) \qquad (1)$$

The relationship between the supersaturation ratio and growth conditions can be found from BCS theory and is shown in equation 2.

$$\alpha_{max} = 1 + \frac{\lambda_0 n_0 R \tau_s}{2\lambda_s h n_{s0}} \tanh\left(\frac{\lambda_0}{4\lambda_s}\right) \approx 1 + A\left(\frac{1}{\lambda_s}\right)^2 \frac{R}{F_{Desorp}} \qquad (2)$$

Figure 2:
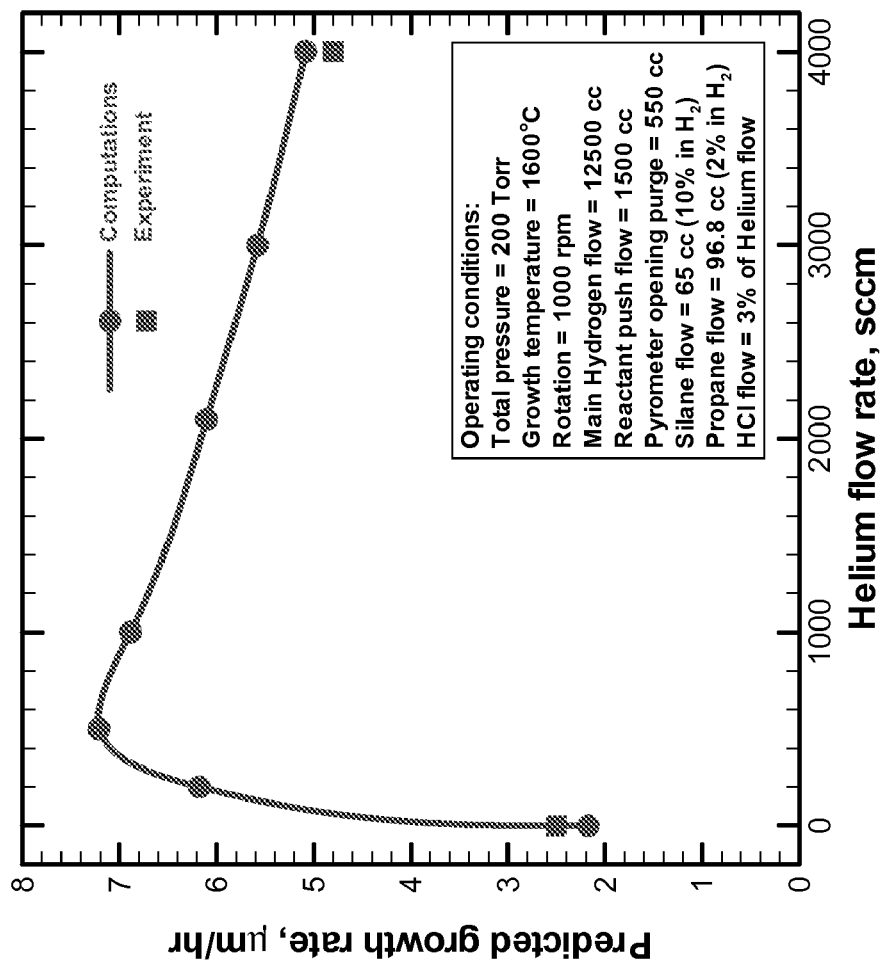
FIG. 2. Simulated growth rate of SiC as a function of the flow of Helium/HCl mixture. HCl is substantially 3% of the gas mixture.

In these equations 1 and 2, R represents the arriving flux of Si atoms, $\lambda_s$ represents the diffusion length, $\lambda_0$ represents the terrace width, $n_0$ is the total density of adatoms sites on the surface, h is the step height, $n_{s0}$ is the adatom concentration at equilibrium, $\tau_s$ is the mean residence time of Si atoms on the surface and A is a constant. $F_{Desorp}$ represents the desorption flux. As detailed in our previous patents, the growth rate of SiC is a function of chlorine in the reactant gases. FIG. 2 shows the simulated experimental growth rate as a function of HCl flow. Note that for values of HCl where the ratio of HCl/Si is greater than 9, the growth rate decreases. This indicates that desorption of Si species ($F_{Desorp}$) from the growth surface is increasing. The important conclusion is that, for a given growth temperature and growth rate (assuming $\lambda_s$~constant), the supersaturation ratio can be controlled by chlorine variation. This enables us to optimize the growth conditions independent of temperature and growth rate, allowing us to obtain high quality "on-axis" homo-epitaxy. Without Cl addition, it is only possible to change the desorption rate by increasing or decreasing the temperature (changing the evaporation rate from the Si surface), as indicated earlier.

Experimental measurements of the diffusion length of Si on the surface of SiC have indicated that the diffusion length decreases as the SiC growth rate increases. We believe that this data indicates that the diffusion length is inversely related to the supersaturation ratio. This was also observed by Nishizawa in his Si growth studies [J. Nishizawa, Y. Kato and M. Shimbo, J. Crystal Growth 31 290 (1975)]. Therefore, the supersaturation ratio as a function of chlorine should change faster than the ratio of species arrival to species desorption.

Figure 3:
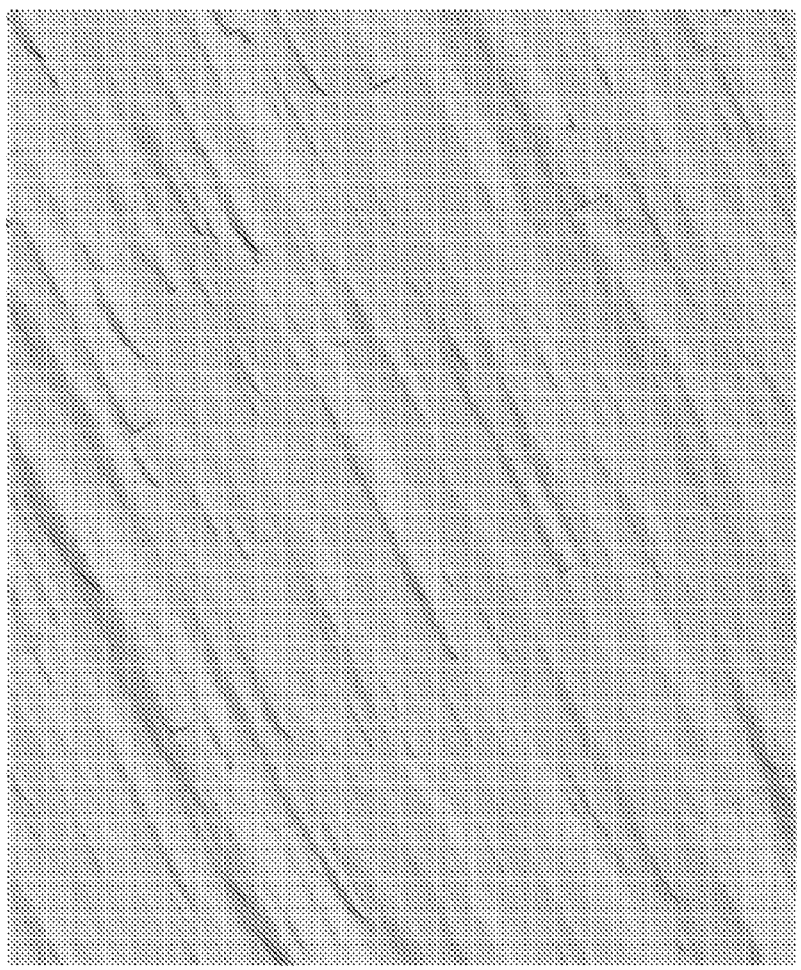
FIG. 3 shows the surface of an on-axis growth produced under optimal conditions.
Figure 4:
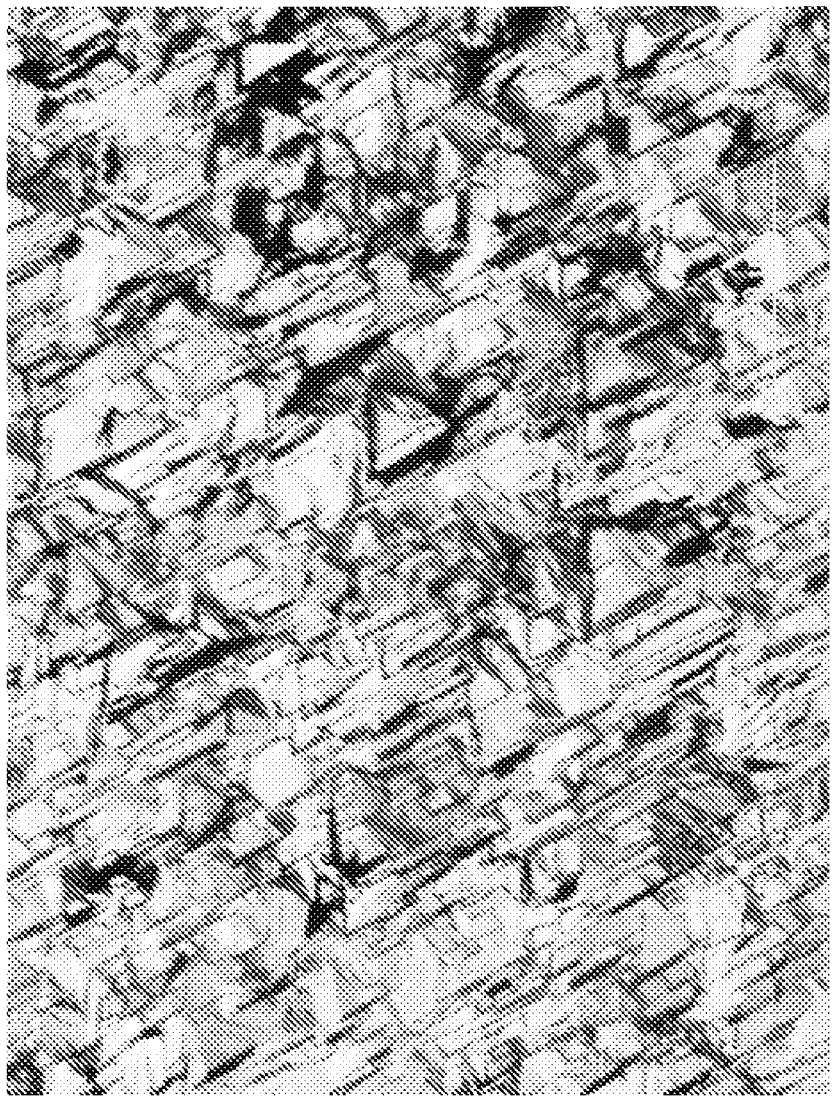
FIG. 4 shows the surface of a SiC wafer grown under sub-optimal conditions. (The features in FIG. 4 can be ascribed to 2D nucleation under high supersaturation conditions. Under optimal conditions, a smooth featureless surface is obtained as shown in FIG. 3).

FIG. 3 shows the surface of an on-axis growth produced under optimal conditions. FIG. 4 shows the surface of a SiC wafer grown under sub-optimal conditions. The features in FIG. 4 can be ascribed to 2D nucleation under high supersaturation conditions. Under optimal conditions, a smooth featureless surface is obtained as shown in FIG. 3.

Figure 5:
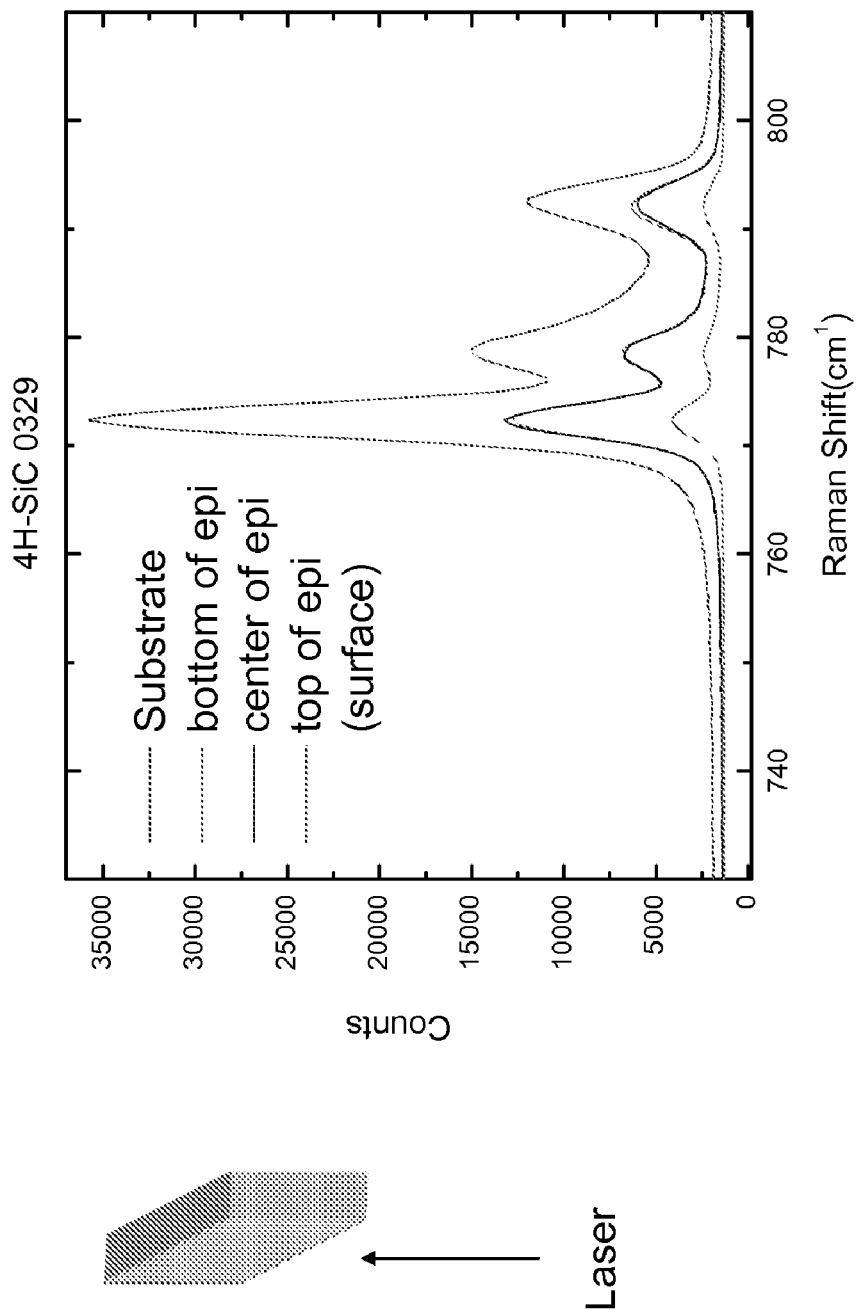
FIG. 5. Optical measurement of a sample. This data indicates that the sample is free from 3C—SiC polytype inclusions.

In the implementation shown and described herein, substrates which have been CMP-polished, followed by a finishing etch, to remove the subsurface damage were used. The finishing is done by high temperature HCl. FIG. 5 is the Raman measurement of an on-axis epitaxial film. The laser was moved to different positions, as indicated in the insert. The result shows that the scan from the epilayer has the same features as the substrate, indicating no 3C inclusions.

The disclosure is not limited to specific compounds and elements discussed above. Modifications in the types of halogenated carbon precursors (such as halogenated hydrocarbons, e.g. $CHCl_3$ or $CH_3Cl$, or methyl-containing compounds, such as $CHCl_2$—$CH_3$, and others) may be applied, without departure from the spirit and scope of the invention.

The precursors can be any other chemical compound, element, or mixture, as long as the ratio, amount, or percentage of the decomposed species stay substantially the same or similar. In addition, the temperatures, flow rates, dimensions, and other design and growth parameters can be varied, as long as the main objectives of the invention, mentioned above, are more or less satisfied. It can also be applied to semiconductors other than SiC and its related compounds.

In some embodiments, for the 0 to 1 degree range a mis-cut toward <1,0,−1,0> direction for the substrate orientation/cut can be used.

Note that an optimum result is obtained for a planar cut approximately 0-1 degrees toward the principal axis, for the substrate, for the optimum growth results.

Note that an optimum result is obtained for the off-axis, 0 to 1 degree off, along <1100> direction or <1,1,−2,0> direction, from the basal plane.

Note that more than one optimum sets of situations/parameters may exist that locally/relatively optimizes the growth quality for the epilayers, e.g. reduces the defect densities.

Note that for the extremely high Cl/Si ratios, as Cl increases, the growth rate goes down again, surface becomes rougher, and the material quality degrades.

Note that different materials give the same type of results, with small modification of the parameters for the growth/substrate.

Note that Chlorine lets us go to a higher growth rate and to a lower/smaller angle cut for substrate, with the same material quality.

Note that any Halogens, such as Fluorine and others, can also be used for these chemical compounds/reactions, instead of Chlorine.

Note that the growth rate curve versus the Cl/Si concentration ratio usually has a peak for the highest growth rate, for a given silane or Si concentration. The height of the peak and the position of the peak are dependent on the silane or Si concentration. Thus, for the growth rate, we will obtain a family of curves which are changing based on silane or Si concentration. Thus, the range of the Cl/Si ratios mentioned above (or its reverse value, Si/Cl ratio) in this disclosure is only a relative ratio and should be considered within the context of the Si concentration (for a specific or given Si concentration). Or, equivalently, it can be expressed based on (or relative to) the Carbon concentration/range. Or, equivalently, it can be expressed based on (or relative to) the Si/C concentration ratio (value, values, or range of values). That is, it is expressed for a given value of (or corresponds to) Si/C ratio. This can be a single value or a range of values. The optimum condition(s) can be a single set or multiple sets of parameters/conditions/ranges.

Note that for the above discussion, we have provided specific range/values of Si/C ratio as an optimum range of parameters, as shown above. However, it should be noted that this ratio or range is not unique, and it is dependent on the absolute value of the Si concentration (i.e. the ratio is given or expressed, for a given Si concentration).

The growth may be on multiple substrates. It can be on any shape substrate, e.g. flat or non-flat. It can be on any form substrate, e.g. in powder-form, gel-form, solid-form, or liquid-form.

Thus, in one of the embodiments, growth occurring without "enough" HCL (2D nucleation and 3C inclusions) can be ascribed to high local supersaturation of the crystal. This high supersaturation is driven by the high growth rate, as well as the large terrace widths of the on-axis substrates. It is shown that the reduction in local supersaturation is due to the increased "excess" Cl, which increases the desorption flux of Si species in the form of volatile chlorides (indicated in the simulations as a reduction in growth rate). In the absence of HCl, desorption of Si can be accomplished using thermal evaporation. The upshot of this is that high growth temperatures are required in order for the crystal to growth close to equilibrium at high growth rates/and or on on-axis substrates. With HCl this requirement is removed.

Any variations of the teachings above are also meant to be covered and protected by the current disclosure.

The invention claimed is:

1. A system for the growth of semiconductor material, said system comprising:
   a substrate holder,
   a chamber,
   wherein said substrate holder holds a substrate,
   a water cooling unit;
   a cooled insert located near a shower-head and an inlet; and
   a heat-shielding insert, attached to said cooled insert, at two ends of said heat-shielding insert;
   wherein said heat-shielding insert is located near said shower-head and said inlet.

2. A system as recited in claim 1, wherein said substrate is a SiC substrate.

3. A system as recited in claim 1, wherein said system is a chemical vapor deposition system.

4. A system as recited in claim 1, wherein said system comprises multiple substrates.

5. A system as recited in claim 1, wherein said substrate is one or more of the following forms: non-flat substrate, in powder-form, in gel-form, in solid-form, flat substrate, or in liquid-form.

6. A system as recited in claim 1, wherein said system is a system for the growth of device epilayers.

7. A system as recited in claim 6, wherein said device epilayers are one or more of the following device structures: bipolar device, PN junction, diode, PIN, transistor, rectifier, FET, device with a quantum well, device with a heterojunction interface, device with multiple P and N layers, or laser.

8. A system as recited in claim 6, wherein said device epilayers comprise one or more SiC layers.

9. As system as recited in claim 6, wherein said device epilayers comprise one or more wide bandgap semiconductor layers.

10. A system as recited in claim 1, wherein said semiconductor material comprises one or more polycrystalline layers.

11. A system as recited in claim 1, wherein said substrate is cut or sliced in range of 0 to 1 degree off axis.

12. A system as recited in claim 1, wherein said substrate is cut or sliced in range of 0 to 10 degrees off axis.

13. A system as recited in claim 1, wherein said substrate is prepared or modified by a chemical, compound, or agent which produces closely-spaced step-producing growth surface for said substrate.

14. A system as recited in claim 1, wherein said substrate is prepared or modified by a chemical, compound, or agent which etches the growth surface for said substrate.

15. A system as recited in claim 1, wherein said substrate is prepared or modified by a chemical, compound, or agent before growth process.

* * * * *